United States Patent [19]

Seliger

[11] 4,310,743
[45] Jan. 12, 1982

[54] ION BEAM LITHOGRAPHY PROCESS AND APPARATUS USING STEP-AND-REPEAT EXPOSURE

[75] Inventor: Robert L. Seliger, Agoura, Calif.

[73] Assignee: Hughes Aircraft Company, Culver City, Calif.

[21] Appl. No.: 78,539

[22] Filed: Sep. 24, 1979

[51] Int. Cl.³ .................................................. B23K 15/00
[52] U.S. Cl. ..................... 219/121 EB; 219/121 EM; 219/121 ER; 219/121 EX
[58] Field of Search ................. 427/35, 53.1, 43.1; 219/121 EB, 121 EE, 121 EJ, 121 EK, 121 EM, 121 ER, 121 EX, 121 L, 121 LM, 121 LY, 121 LP, 121 LH, 121 LJ; 250/492 A, 492 B; 430/312, 313, 319; 156/628, 643

[56] References Cited

U.S. PATENT DOCUMENTS

| | | | |
|---|---|---|---|
| 3,619,608 | 11/1971 | Westerberg | 148/1.5 X |
| 3,644,700 | 2/1972 | Kruppa et al. | 219/121 EB |
| 3,683,195 | 8/1972 | Johannsmeier et al. | 250/492 A |
| 3,840,749 | 10/1974 | O'Keeffe et al. | 250/492 |
| 3,875,416 | 4/1975 | Spicer | 219/121 EB X |
| 3,900,737 | 8/1975 | Collier et al. | 219/121 EK X |
| 4,037,969 | 7/1977 | Feldman et al. | 356/172 |
| 4,051,381 | 9/1977 | Trotel | 250/492 A |
| 4,084,095 | 4/1978 | Wolfe | 250/492 A |
| 4,109,029 | 8/1978 | Ozdemir et al. | 250/492 A X |
| 4,145,597 | 3/1979 | Yasuda | 219/121 EW X |
| 4,158,141 | 6/1979 | Seliger et al. | 250/492 B X |
| 4,169,230 | 9/1979 | Bohlen et al. | 250/492 A |

OTHER PUBLICATIONS

Wittekoek, S., "Step and Repeat Wafer Imaging", *Semiconductor Microlithography V*, vol. 221, Published by the Society for Photo-Optical Instrumentation Engineers, Mar. 17, 1980.
Feder et al., "Mask to Wafer Alignment System", IBM Tech. Disc. Bull., vol. 16, No. 4, Sep. 1973, p. 1306.
Warner, Jr., "Photo-Mask Fabrication", *Integrated Circuits Design Principles and Fabrication*, McGraw-Hill Co., New York, pp. 151-153.
Operation Manual for "Canon Fine Pattern Projection Mask Aligner with Auto Feed, FPA-141F".
Tobey, A., "Wafer Stepper Steps up Yield and Resolution in IC Lithography", *Electronics*, Aug. 16, 1979, pp. 109-112.
Ozdemir et al., "Computer Controlled Scanning Electron Microscope System for High Resolution Microelectronic Pattern Fabrication", *IEEE Trans. on Electron Devices*, vol. ED-19, No. 5, May, 1972, pp. 624-628. 4n 30 Miyauchi et al., "Automatic Pattern Positioning of Scanning Electron Beam Exposure", *IEEE Transactions on Electron Devices*, vol. ED-17, No. 6, Jun. 1970, pp. 450-457.

*Primary Examiner*—C. L. Albritto
*Attorney, Agent, or Firm*—Mary E. Lachman; W. H. MacAllister

[57] ABSTRACT

A high-resolution high-throughput ion beam lithography process and apparatus for exposing a large area target by a step-and-repeat process which accommodates lateral wafer distortions in the target and optimizes the resolution, throughput, yield, and cost of the process. First there is provided: a target having predetermined segments defined thereon, with the area of each segment being chosen to optimize the resolution, throughput, yield, and cost of the process; a mask placed in proximity to said target, to define the patterned ion beam; a collimated ion beam with a diameter approximately equal to the diameter of the mask, which is projected through the mask to form the patterned ion beam; and a means for aligning the mask and a selected segment of the target. The size of the mask is equal to or larger than the size of one of the predetermined segments of the target and the pattern area of the mask is smaller than the area of one of the selected segments of the target. Next, the mask is aligned with a first selected segment of the target and this first segment is exposed to the patterned ion beam, formed by projecting the collimated ion beam through the mask. Then, the mask is aligned with a second selected segment of the target and this second segment is exposed to the patterned ion beam. Thus, selected segments of the target are exposed to the projected ion beam pattern in a step-and-repeat manner.

10 Claims, 1 Drawing Figure

ION BEAM LITHOGRAPHY PROCESS AND APPARATUS USING STEP-AND-REPEAT EXPOSURE

TECHNICAL FIELD

This invention relates generally to micropattern generation and replication techniques, and, more particularly, to a novel ion beam lithographic process and apparatus for forming high resolution resist patterns on a large wafer by a step-and-repeat exposure method.

BACKGROUND ART

In the fabrication of semiconductor integrated circuits and devices, an important goal has been the increased microminiaturization of these circuits and devices in order to produce structures having minimized size and maximized component density and speed. One step that is critical to these microminiaturization requirements is the definition of patterns in resist. Openings in the resist, formed by lithographic exposure and development processes, serve as a mask pattern for subsequent fabrication steps, such as etching, depositing metal patterns, or forming ion implanted regions. To achieve increased microminiaturization of integrated circuits, a lithography technique is needed which will produce a resist pattern with high resolution. In addition, in order to obtain a reasonable wafer throughout (i.e. wafers/hour), the process for exposing the resist pattern must be of reasonably high speed.

In the art of photolithography useful in the creation of resist patterns, ultraviolet radiation has been used for many years to expose a variety of known photoresist materials. While this technique is capable of providing a good throughput, it is not satisfactory for certain high resolution fabrication processes, such as those required for the fabrication of devices having submicrometer dimensions, since the ultraviolet radiation itself has limitations with respect to its diffraction and resolution characteristics which are dependent upon the wavelength of the ultraviolet radiation. For example, if a high resolution pattern is projected through an optical lens over a large area target, there will be distortions and reduced line resolution at the edges of the field due to the inherently small field of view of the lens. In order to overcome some of the limitations of optical lithography methods, other resist exposure technologies have been developed which use radiation with wavelengths shorter than those of ultraviolet radiation, namely electrons, x-rays, and ions. While all three of these latter techniques have demonstrated certain advantages over ultra-violet photolithography, both the x-ray and direct writing electron beam processes are time-consuming and do not readily lend themselves to the high throughput required for large scale batch fabrication processes.

Further, the direct writing electron beam process, in which an electron beam is scanned over a target in a predetermined pattern under computer control, has certain limitations when applied to large area targets. For example, the field of view of the focused electron beam is restricted by the resolution requirements for the device being formed. As the field size of a scanning electron beam is increased, there is an undesirable increase in distortions and decrease in line resolution due to beam defocusing at the edges of the field. In addition, deflection aberrations of the electron beam cause distortion of the shape of the electron beam and consequently produce pattern distortions and reduced pattern resolution. Finally, it is complex to produce and implement high speed electronics for the deflection of an electron beam over a large area target. Thus, a distinct limitation of both optical projection lithography and direct writing electron beam lithography is that their fields of view are inherently limited and cannot be chosen to optimize process parameters, such as throughput.

Some of the above-mentioned problems are overcome by the use of an electron projection lithographic process. However, the latter process exhibits adverse proximity effects when exposing closely spaced pattern features of varying size. The ion beam lithographic technique has been found to be a method which produces high resolution patterns at high speed, does not have an adverse proximity effect, does not have an inherent limit to the field of view, and is the subject of this invention.

The utilization of collimated ion beams to expose certain known and commerically available polymer (resist) materials is generally known in the art of ion beam lithography and is disclosed, for example, in an article entitled "Focused Ion Beams in Microfabrication," by R. L. Seliger and W. P. Fleming, in *The Journal of Applied Physics*, Vol. 45, No. 3, March 1974 and in U.S. Pat. No. 4,101,782 and No. 4,158,141, both assigned to the present assignee. The processes of these latter-referenced patents make use of an off-contact technique in which there is a space between the mask and the target resist. One advantage of such an off-contact process is that the mask is prevented from being contaminated during use and can be reused many times. While the prior art ion beam lithography processes are satisfactory for the exposure of a wafer having a small area, e.g. one square centimeter, the processes noted above do not specifically address the optimum technique for exposing large area wafers, e.g. four inches in diameter. In particular, in the exposure of a large area wafer by an off-contact process, the diameters of both the beam and the mask, which are critical parameters, has not been discussed. The optimum choice of these diameters and a process and apparatus for achieving large wafer exposure are required for the practical application of an ion beam lithography process.

If the beam and mask diameters coincide with the diameter of the wafer (e.g. four inches), several problems arise. First of all, it is difficult to produce a collimated beam of large diameter that would be required to maintain a minimum lateral beam displacement of less than 0.1 micrometer at the target in order to produce the desired high-resolution patterns. Secondly, fabrication of a large mask requires more time, produces a lower yield, and has a higher cost than fabrication of a smaller mask. Furthermore, a dimensional tolerance in the mask of 0.1 micrometer is required for the production of devices having submicrometer dimensions. In order to maintain this tolerance over a mask of four inches in diameter, a tolerance of one part in $1 \times 10^6$ would have to be maintained over the entire mask area, which would be difficult to achieve.

Finally, there exists the problem of lateral wafer distortions which occur when the wafer becomes heated and expands as a result of certain high temperature processing steps, such as diffusion, thermal oxidation, or epitaxial growth. It is estimated that even with careful control of thermal processes, silicon wafers will have an in-plane distortion, or "runout," of approximately one part in $1 \times 10^5$, or 0.1 micrometer in one centimeter.

This distortion must be taken into consideration during the multiple masking and alignment procedures usually required in the fabrication of a semiconductor device or inegrated circuit. For example, benchmarks may be formed at the periphery of a wafer for purposes of alignment when using a mask which is the same size as the wafer. The mask and wafer are aligned by the benchmarks and a processing step, such as etching, is performed. Then, the wafer may be subjected to an oxidation process at a high temperature (i.e. 1100° to 1200° C.). During heating, the wafer expands, and when the wafer is subsequently cooled, it contracts. However, such expansion and contraction results in distortion of the geometry of the wafer. The total wafer may increase or decrease in size or the wafer may increase in length along one axis and decrease in length along another axis, resulting in an elliptical shape. As the wafer becomes distorted in shape, the benchmarks change position on the wafer. Thus, the original benchmarks formed on the wafer cannot be used for alignment in a subsequent processing step. In addition, any structures, such as gates, which were formed on the wafer prior to a process such as oxidation have also changed position or had their geometries distorted as a result of the expansion and contraction of the wafer. Thus, it is difficult to align these structures with the next level of masking required for forming these desired device. For the reasons, choosing the beam and mask diameters to be equal to the wafer diameter, while yielding a high throughput, does not readily provide the desired high resolution required for microminiaturization of integrated circuits and devices.

A possible alternative procedure for the exposure of a large area wafer uses an ion beam of small cross-section (e.g. one centimeter$^2$) and a mask which is equal in size to the wafer. The ion beam is then raster scanned over the mask and wafer in order to expose the resist on the total wafer, using a form of serial ion exposure. This procedure has the same disadvantages as noted above with respect to difficulty in fabricating a large area mask, difficulty in maintaining required dimensional tolerances in the mask, and the problem of lateral wafer distortion which occur in the process which uses a wide collimated beam. In addition, the process which uses a narrow, raster scanned beam requires particularly close control of the deflection angle of the ion beam in order to replicate the desired pattern accurately. Although satisfactory control of the ion beam deflection can be achieved, a complex and expensive system is usually required.

SUMMARY OF THE INVENTION

The general purpose of this invention is to provide a new and improved high-resolution, high-throughput ion beam lithography process and apparatus for exposing a large area target, which possesses most, if not all, of the advantages of the above prior art ion beam lithography processes, while overcoming the above-mentioned limitations.

The above general purpose of this invention is accomplished by successively exposing selected segments of a large area target to a patterned ion beam in a step-and-repeat manner which accommodates lateral distortions in the target and optimizes the resolution, throughput, yield and cost of the process. A first selected segment of the target is aligned with and exposed to the patterned ion beam. Next, the target is moved in a step from the first selected segment of the target to a subsequent selected segment thereof. The subsequent segment is then aligned with and exposed to the patterned ion beam. The process of moving the target in steps from one selected segment to the next and aligning the selected segment with and exposing it to the patterned ion beam is repeated for successive segments of the target to ultimately expose the total target.

More particularly, there is first provided: a target having predetermined segments defined thereon, with the area of each segment being chosen to optimize the resolution, throughput, yield, and costs of the process; a mask placed in proximity to said target, to define the patterned ion beam; a collimated ion beam with a diameter approximately equal to the diameter of the mask, which is projected through the mask to form the patterned ion beam; and a means for aligning the mask and a selected segment of the target. The size of the mask is equal to or larger than the size of one of the predetermined segments of the target and the pattern area of the mask is smaller than the area of one of the selected segments of the target. Next, the mask is aligned with a first selected segment of the target and this first segment is exposed to the patterned ion beam, formed by projecting the collimated ion beam through the mask. Then, the mask is aligned with a second selected segment of the target and this second segment is exposed to the patterned ion beam. Thus, selected segments of the target are exposed to the projected ion beam pattern in a step-and-repeat manner.

Accordingly, it is an object of the present invention to provide a new and improved ion beam lithography process and apparatus for exposing a large area target, while maintaining a high resolution pattern definition and a high throughput.

Another object is to provide a process and apparatus of the type described which overcome the problem of lateral wafer distortion.

Yet another object is to provide a process and apparatus of the type described which optimize process parameters, such as resolution, throughput, yield, and cost of the lithographic process.

Another object is to provide a process and apparatus of the type described which provide the freedom of choosing the size of selected segments of the target so that the process parameters described above may be optimized.

Still another object is to provide a process and apparatus of the type described which provide the versatility of choosing the size of selected segments of the target as required for a given application of the process.

Another object is to provide a new and improved process and apparatus of the type described which use a limited area mask rather than a target size mask, and avoid the problems of large-area mask fabrication and dimensional tolerance, while taking advantage of the reduced cost for fabricating a limited area mask.

A further object of the present invention is to provide a new and improved process and apparatus of the type described which have a relatively high speed as compared to some prior art processes.

One feature of the present invention is that a step-and-repeat process is used.

The foregoing and other objects, advantages, and feature of the present invention will be apparent from the following more particular description of the preferred embodiments of the invention, as illustrated in the accompanying drawing.

BRIEF DESCRIPTION OF THE DRAWING

The FIGURE is a schematic diagram of a simplified apparatus for implementation of the process of the present invention.

DETAILED DESCRIPTION OF THE INVENTION

Figure 1:
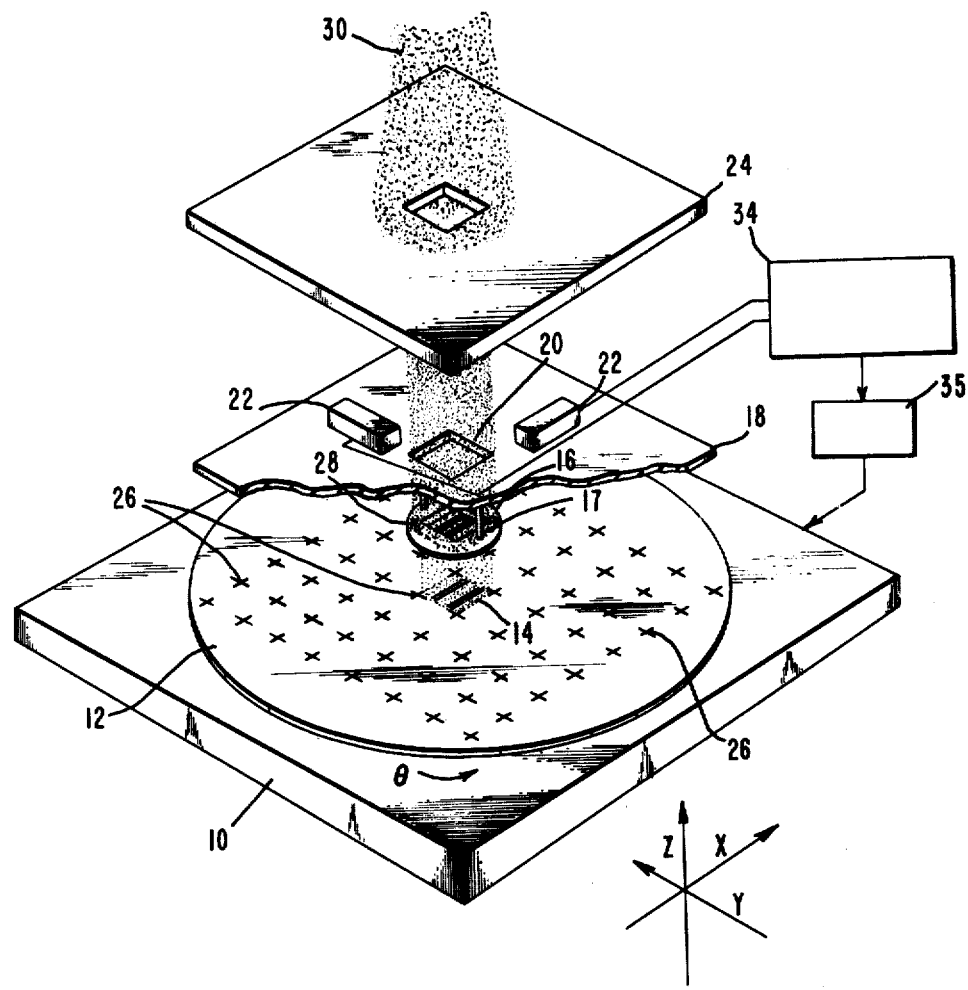

The FIGURE shows, in simplified form, an apparatus for implementation of the process of the present invention. A platform or stage 10, which is made of a low density metal such as magnesium, and has dimensions somewhat larger than a target 12, supports the target 12. The target 12 is illustrated in the FIGURE as a semiconductor wafer having defined thereon a predetermined area comprising a chosen number of predetermined fractional areas or segments of approximately equal size, such as a segment 14, which is typically 1 centimeter long and 1 centimeter wide, and having the segments arranged in rows or columns as shown in the FIGURE. The size of the segment 14 is chosen to optimize certain process parameters, including the requirements for high resolution, high throughput, high yield, and reasonable mask cost. For example, the size of the segment 14 is determined, in part, by the wafer distortion tolerance required, i.e. the smaller the acceptable tolerance, the smaller the segment 14 would have to be to accommodate the distortions in the wafer which were produced during high temperature processing steps, as discussed previously and also below. The segment 14 would preferably be at least the size of a typical integrated circuit (i.e. 1 cm$^2$) and could be as large as is consistent with the distortion tolerance requirements and the increased costs of making the larger mask which would be required for a larger segment 14. With these requirements for the size of the segment 14, any number of equally sized segments may be used in practicing the present invention.

The boundaries of adjacent segments similar to the segment 14 on the target 12 are defined by alignment marks 26, the function of which is discussed below. The form of the alignment marks 26 is determined by the alignment detector being used and may be a relief pattern, such as crossmarks or openings etched into the substrate, or a structure formed on top of the substrate, such as a pattern of crosses formed of a metal or an oxide and pattern-etched using conventional photolithographic masking and etching techniques. The alignment marks are formed on the substrate prior to the deposition of a resist layer and must be capable of being detected through the resist layer subsequently deposited thereon.

The platform 10 may be moved in a controlled manner along the x and y axes and optionally along the z axis shown in the FIGURE and may be rotated in a horizontal plane by the angle $\theta$, also shown in the FIGURE. (The rotation $\theta$ is required in order to align the mask 16 with any existing structures formed in a selected segment 14 of the target 12.) The platform 10 is provided with an electromechanical means (not shown) that receives an electrical signal from an electromechanical positioning transducer 35 and provides a corresponding mechanical motion of the platform 10 along the x, y, or z axes or about the angle $\theta$, as is discussed in more detail below.

Placed above the target 12 at a distance of 10 to 25 micrometers, there is an ion beam mask 16 which defines the predetermined pattern of an ion beam 30 which subsequently passes through the mask 16. The ion beam 30 may consist of protons or other ions, such as helium or lithium, which are compatible with the requirements of the mask, the resist, and the substrate. The mask 16 contains thereon alignment marks 28, the configuration of which depends on the alignment detection means which is used. The alignment marks 28 may, for example, consist of optical grating patterns if an optical detector is used for alignment. The mask 16 may be of the type described in U.S. Pat. No. 4,101,782, assigned to the present assignee, in which a hyperthin taut amorphous membrane of a material such as aluminum oxide ($Al_2O_3$) is used as the support member for an ion absorption mask or may be of the type described in U.S. Pat. No. 4,158,141, also assigned to the present assignee, in which a thin monocrystalline membrane of less than two micrometers in thickness has a patterned ion absorbing region or regions adjacent to one surface thereof. Other suitable ion transmission masks may also be used. The mask 16 may be attached to the bottom surface of an aperture plate 18 by rigid metal rods, such as a rod 17 shown in the FIGURE, and is aligned with an opening 20 in the plate 18. Rather than being permanently affixed to the aperture plate 18, as indicated in the FIGURE, the mask 16 may optionally be placed on a movable platform that is affixed to the aperture plate 18, so that the mask may be rotated in a horizontal plane by the angle $\theta$ relative to the selected segment of the target.

The opening 20 in the aperture plate 18 is typically one centimeter long and one centimeter wide and functions to collimate and define a predetermined cross-section of the ion beam 30 which passes therethrough. The area of the collimated ion beam must be at least as large as the area of the mask 16, and, in practice, is substantially equal to the area of one selected segment 14. The aperture plate 18 is made of a metal, such as molybdenum, and is typically 5 cm $\times$ 5 cm and 1 to 2 millimeters thick. On the upper surface of the aperture plate 18, there are placed alignment detectors 22, which detect the degree of alignment of the mask 16 with the selected segment 14 of the target 12, and transmit a corresponding signal to a signal processor 34. The alignment detectors 22 may make use of optical techniques in order to detect light reflected from the alignment marks 26 and 28, as discussed, for example, in U.S. Pat. No. 4,037,969, but other alignment detection techniques may also be used. The signal processor 34 then produces an error signal and transmits it to the transducer 35, which causes corresponding motion of the platform 10, as discussed in more detail below.

A series of aperture plates, such as the plate 24, may be placed above the aperture plate 18 in order to maximize collimation of the ion beam 30. The distance between the aperture plate 18 and the aperture plate 24 is typically one meter or more.

In practicing the process of the present invention, initially the target 12 is placed on the platform 10. The target 12 is typically a wafer of a semiconductor material which is four inches in diameter and which has a layer of resist material, such as polymethylmethacrylate, coated thereon. The wafer is divided into selected segments, which are typically one centimeter by one centimeter and which are defined by placing the alignment marks 26 at the boundaries between adjacent segments of the wafer. Using the apparatus described in the FIGURE, with the mask 16 placed at a distance of 10 to 25 micrometers from the surface of the target 12, the position of the alignment marks 28 on the mask 16 with respect to the corresponding alignment marks 26 on the target 12 is sensed by the alignment detectors 22, which then produce a corresponding error signal that is transmitted to the signal processor 34. The error signal from the detectors 22 is compared to a reference signal in the signal processor 34, which provides a corresponding correction signal to the transducer 35. The signal processor 34 consists of standard electronic components, including an operational amplifier which compares the error signal input with a predetermined reference signal to generate a corresponding correction signal. Upon receipt of the correction signal from the signal processor 34, the transducer 35 produces corresponding motion of the stage 12 in the x, y, or z direction so that the selected segment 14 of the target 12 is aligned with mask 16. This method of aligning a mask and substrate is generally described in U.S. Pat. Nos. 4,109,029 and 4,019,109, both assigned to the present assignee.

In practicing the present invention, it is necessary to move the platform 10 in a series of steps, with each step having a length corresponding to the width of the selected segment of the target (e.g. 1 cm), in order to move the patterned ion beam from one selected segment to the next. It has been found to be advantageous to conduct this movement of the platform 10 in the required step, in two stages. In the first stage, the platform 10 is moved in the x and y (and optionally z) directions in relatively large increments in order to move the target 12 so that the next selected segment is coarsely aligned with the mask 16. Then, in a second stage, fine motions of the target 12 along the x and y (and optionally z) axes and of the target 12 or the mask 16 in the rotation angle $\theta$ are performed in order to produce a fine alignment of the selected segment 14 of the target 12 with the mask 16. If an automated alignment means is used, motion of the platform 10 is controlled by the electromechanical means which moves in response to signals from the transducer 35. In order to produce a satisfactory throughput, the alignment of the target 12 with the mask 16 should be accomplished within approximately one second.

After the selected segment 14 of the target 12 and the mask 16 have been aligned, a beam of selected ions is projected as shown in the FIGURE perpendicular to the surface of the target. For example, a beam of protons having an accelerating voltage of 150–250 kiloelectronvolts (keV), a dose of $2 \times 10^{13}$ protons per centimeter$^2$, and a beam current of less than one microampere may be used for a polymethylmethacrylate resist having a thickness of approximately 1.3 micrometers. An ion beam shutter mechanism is opened in order to produce a pulsed ion beam which impinges on and exposes the selected segment 14 of the target 12. A typical exposure time of less than one second is used. The ion beam 30 is collimated by the aperture plates 24 and 18. Thus, the masked ion beam pattern is projected onto the plane of the resist-coated wafer (target 12). Exposure of the selected segment 14 to the patterned ion beam causes exposure of selected portions of the resist in segment 14, which are later developed to form the desired resist pattern. Following the procedure described above for the first selected segment of the target 12, the platform 10 is moved so that the second selected segment of the target 12 is aligned with the mask 16. The ion beam shutter is again opened so that the second selected segment of the target 12 may be bombarded by and exposed to the ion beam 30. In this manner, the target 12 is moved laterally one step at a time to complete successive individual rows or columns, in order to independently expose each successive selected segment of the target 12 to the patterned projection of the ion beam 30 by a step-and-repeat process and thus expose the entirety of the predetermined area of the target 12.

The step-and-repeat process of the present invention has the significant advantage over the prior art processes discussed above in that the field size can be optimized so that process-induced, in-plane wafer distortions, or "run-out", may be accommodated. Since the mask is reregistered over each selected segment of the target by the process of the present invention, these distortions can be accommodated and tolerated, cumulative effects of wafer distortion are eliminated, and the line resolution of the exposed pattern is improved. As previously discussed, this distortion has been estimated to be about one part in $10^5$, or 0.1 micrometer in one centimeter.

In addition, by the process of the present invention, the field size or the size of each selected segment of the target can be selected in order to achieve an optimal compromise between the competing process requirements for high resolution, high throughput, high yield, and reasonable mask cost. In particular, the size of the selected segments can be chosen to accommodate the degree of wafer distortion produced in a particular processing step or steps. Further, the size of the selected segments of the target may be different sizes for the formation of different devices or circuits and may even be of different sizes for various steps within the process for forming a particular device or circuit. Furthermore, the present invention uses a limited area mask in order to expose a large wafer and thus a small mask (i.e. one centimeter$^2$) which is fabricated with greater ease, higher yield, and lower cost than a large (i.e. four inch) mask may be used. In addition, the dimensional tolerance of the small mask used in the present invention is more easily maintained than the dimensional tolerance of a large area mask. A dimensional tolerance of 0.1 micrometer over a one square centimeter mask represents one part in $10^5$, which corresponds to approximately 2° C. of thermal expansion of a silicon wafer. By comparison, for a four inch (10 centimeter) diameter mask, a significantly higher tolerance of one part in $10^6$ would have to be maintained over a mask area that contains 49 segments, each of a 1 cm$^2$ area. Furthermore, the ion beam exposure process is simplified by the present invention since a straightforward, stationary collimated ion beam is employed, rather than using a raster scanned ion beam as discussed in relation to one of the above prior art processes.

Using the process of the present invention with an ion beam with a current of 16 microamperes, 1 cm$^2$ of the target can be exposed in 0.2 seconds, the total beam on-time for a four inch wafer would be less than ten seconds and the total processing time for a four inch wafer would be less than one minute. By comparison, the prior art direct writing electron beam process which uses a small field of view with a serially scanned electron beam might require a total processing time of approximately one hour for a four inch wafer. Thus, the process of the present invention improves the speed with which the total wafer can be exposed as compared to such a prior art process and provides the high-throughput required for large scale batch fabrication of devices of submicrometer dimensions. Finally, the process and apparatus of the present invention have the advantage that a 1 cm² mask can be more uniformly spaced a predetermined distance away from the wafer and more easily placed than a four inch diameter mask can. Also, by the process and apparatus of the present invention, the distance between the mask and wafer can be readily readjusted to accommodate large wafers that are not flat.

While the present invention has been particularly described with respect to the preferred embodiments thereof, it will be recognized by those skilled in the art that certain modifications in form and detail may be made without departing from the spirit and scope of the invention. In particular, the scope of the invention is not limited to an ion beam composed of protons, but is intended to include beams of other light ions, such as helium and lithium, which are suitable for exposure of the selected target. The target is not limited to a resist-coated wafer, which was used merely as an example, but may include any target which requires ion beam exposure. In addition, the means for aligning the ion beam and the target is not limited to use of the optical detector means discussed herein, and may include other aligning means, both manual and automated. Further, the dimensions of the apparatus described in relation to FIG. 1 may be altered as required to accommodate such variables as the ion beam and exposure parameters, the dimensions of the selected segment of the target and of the mask, and the particular alignment means used. Finally, while the present invention has been described with respect to motion of the target relative to the beam and mask, it is also intended to include within the scope of the present invention any controlled relative movement between the target and the patterned ion beam.

I claim:

1. An ion beam lithography process for exposing a large area target to a patterned ion beam by successive independent exposures in a manner which accommodates lateral distortions in said target comprising:
   (a) aligning a first selected segment of said target and the pattern of said patterned ion beam, the area of said selected segment being chosen to optimize the resolution, throughput, yield, and cost of said process, and the size of said pattern being approximately equal to the size of said first selected segment;
   (b) exposing said first selected segment to said patterned ion beam;
   (c) moving said target in a step of a length substantially equal to the width of said first selected segment, to a second or subsequent selected segment of said target, the area of said second or subsequent segment being substantially equal to the area of said first selected segment;
   (d) aligning said second or subsequent selected segment of said target and said pattern of said patterned ion beam;
   (e) exposing said second or subsequent selected segment to said patterned ion beam, whereby said target is moved in said step from said first selected segment to said second or subsequent selected segment, and said second segment is exposed to said patterned ion beam after the movement in said step and after said aligning, and said movement in said step and said exposure is repeated for additional subsequent selected segments of said target to ultimately expose the total area of said target and to thereby optimize the resolution, throughput, yield, and cost of said process.

2. A process for successively exposing selected segments of a target to a patterned ion beam which comprises:
   (a) providing:
      (i) said target having defined thereon predetermined segments for the purpose of individual segment exposure, the area of each of said predetermined segments being chosen to optimize the resolution, throughput, yield, and cost of said process,
      (ii) a mask placed in proximity to said target, to define said patterned ion beam, the size of said mask being equal to or larger than the size of one of said predetermined segments of said target and the pattern area of said mask being smaller than the area of one of said selected segments,
      (iii) a collimated ion beam with a cross-section diameter approximately equal to the diameter of said mask, said ion beam being projected through said mask to form said patterned ion beam, and
      (iv) means for aligning said mask to a selected segment of said target;
   (b) aligning said mask and a first selected segment of said target, by said aligning means;
   (c) exposing said first selected segment to said patterned ion beam;
   (d) aligning said mask and a second selected segment of said target, by said aligning means; and
   (e) exposing said second selected segment to said patterned ion beam whereby said selected segments of said target are exposed to said patterned ion beam in a step-out-repeat manner which accommodates lateral distortions in said target.

3. A process for successively exposing selected segments of a target to an ion beam pattern, which comprises:
   (a) providing:
      (i) said target having defined thereon predetermined segments for the purpose of individual segment exposure, said target being placed on the surface of a movable platform,
      (ii) a mask placed in proximity to said target, for defining said ion beam pattern, the size of said mask being equal to or larger than the size of one of said predetermined segments of said target and the pattern area of said mask being smaller than the area of one of said selected segments,
      (iii) a collimated beam of selected ions, said beam having a cross-section diameter approximately equal to the diameter of said mask, and
      (iv) means for aligning said mask and said selected segment of said target by moving said platform;
   (b) aligning said mask and a first selected segment of said target by said aligning means;
   (c) passing said collimated beam through said mask toward said first selected segment of said target to expose said ion beam pattern on said first selected segment of said target;
   (d) aligning said mask and a second selected segment of said target by said aligning means; and
   (e) passing said collimated ion beam through said mask toward said second selected segment of said target to expose said ion beam pattern on said second segment of said target whereby said selected segments of said target are exposed in succession to said ion beam pattern.

4. A process for exposing a predetermined area of a target layer of resist on a substrate, in a manner which accommodates lateral distortions in said substrate, which comprises:
 (a) dividing said area into a chosen number of equal segments;
 (b) aligning a patterned ion beam with one of said segments, the pattern of said patterned ion beam being approximately equal in size to said one of said segments; and then
 (c) providing controlled relative movement between said resist layer and said patterned ion beam so that said ion beam successively impinges, in successive steps, each segment in a row or column of segments until the entirety of said predetermined area of said resist has been exposed to said patterned ion beam.

5. The process defined in claim 4 wherein the provision of controlled relative movement includes:
 (a) forming alignment marks or openings at the boundaries of said segments of resist;
 (b) providing an ion beam mask, also having alignment marks or openings thereon adapted for alignment with corresponding marks or openings at the boundaries of said segments of resist;
 (c) sensing the alignment of said ion beam mask with said segments of ion beam resist between each successive ion bombardment step used to successively expose said segments of resist; and
 (d) moving said target layer of resist and said ion beam relative to one another in successive steps until all segments of resist in said target layer have been exposed by said ion beam.

6. A process for exposing a layer of resist on a substrate with an ion beam which comprises:
 (a) providing an ion beam pattern with a cross-sectional area substantially equal to a predetermined fractional area of the total area of said resist layer to be exposed, said predetermined fractional area being chosen to optimize the resolution, throughput, yield, and cost of said process; and
 (b) providing controlled relative and stepped movements between said ion beam and said layer of resist to thereby cause said ion beam to successively expose all the predetermined fractional areas which make up said total area of said resist layer, whereby lateral distortions in said substrate are accommodated, the resolution in the exposure of said pattern in said resist layer is optimized, the cost of the ion beam mask defining said ion beam pattern is minimized, and the throughput and yield of said process are optimized.

7. Apparatus for successively exposing selected segments of a target to a patterned ion beam which comprises:
 (a) a movable platform to hold said target;
 (b) a mask for defining said patterned ion beam on each of said selected segments of said target and being located in proximity to and above the surface of said target, and being approximately equal in size to one of said selected segments;
 (c) means for producing a collimated ion beam having an area which is substantially equal to the area of one of said selected segments;
 (d) means for aligning said mask and one of said selected segments of said target by causing motion of said platform relative to said mask, whereby a first selected segment of said target is aligned by said aligning means with said mask and said first selected segment is exposed to said patterned ion beam produced by passing said collimated ion beam through said mask, and then a second selected segment of said target is aligned by said aligning means with said mask and said second selected segment is exposed to said patterned ion beam.

8. The apparatus set forth in claim 7 wherein said means for producing a collimated ion beam further comprises:
 (a) means for producing a ion beam; and
 (b) an aperture plate to collimate and to define the cross-section of said ion beam and being located between said mask and said means for producing said ion beam whereby said ion beam is projected through said aperture plate to produce said collimated ion beam.

9. The apparatus as set forth in claim 7 wherein said means for aligning said mask and one of said selected segments of said target comprises automated means for moving said platform along one or more orthogonal axes and for rotating said platform in a horizontal plane.

10. The apparatus as set forth in claim 7 wherein:
 (a) said platform is controlled by an electromechanical means;
 (b) said mask is 1 centimeter long and 1 centimeter wide and is placed at a distance in the range of 10 to 25 micrometers from said target;
 (c) said aligning means comprises a precision optical detector.

* * * * *